(12) United States Patent
Wang et al.

(10) Patent No.: US 12,422,616 B2
(45) Date of Patent: Sep. 23, 2025

(54) OPTOELECTRONIC PACKAGE STRUCTURE

(71) Applicant: LITE-ON TECHNOLOGY CORPORATION, Taipei (TW)

(72) Inventors: Cheng-Han Wang, New Taipei (TW); Cheng-Hong Su, Taipei (TW); Chih-Li Yu, New Taipei (TW)

(73) Assignee: LITE-ON TECHNOLOGY CORPORATION, Taipei (TW)

(*) Notice: Subject to any disclaimer, the term of this patent is extended or adjusted under 35 U.S.C. 154(b) by 538 days.

(21) Appl. No.: 17/841,122

(22) Filed: Jun. 15, 2022

(65) Prior Publication Data

US 2022/0404548 A1 Dec. 22, 2022

Related U.S. Application Data

(60) Provisional application No. 63/284,010, filed on Nov. 30, 2021, provisional application No. 63/212,124, filed on Jun. 18, 2021.

(30) Foreign Application Priority Data

Mar. 25, 2022 (CN) .......................... 202220678650.1

(51) Int. Cl.
*G02B 6/12* (2006.01)
*H01L 25/16* (2023.01)
*H10F 77/40* (2025.01)
*H10F 77/50* (2025.01)
*H10H 20/852* (2025.01)

(52) U.S. Cl.
CPC ........ *G02B 6/12004* (2013.01); *H01L 25/167* (2013.01); *H10F 77/413* (2025.01); *H10F 77/50* (2025.01); *H10H 20/852* (2025.01)

(58) Field of Classification Search
CPC .............. G02B 6/12004; H01L 25/167; H01L 31/0203; H01L 31/02327; H01L 33/52; H01L 25/0753; H01L 33/62; H01L 33/483
See application file for complete search history.

(56) References Cited

U.S. PATENT DOCUMENTS

| 3,609,475 | A | * | 9/1971 | Kaposhilin | ............. | H01L 33/62 |
| | | | | | | 257/E33.059 |
| 6,808,950 | B2 | * | 10/2004 | Komoto | ................ | H01L 33/483 |
| | | | | | | 257/E33.059 |
| 7,618,165 | B2 | * | 11/2009 | Kamiya | ............. | H01R 13/7175 |
| | | | | | | 362/800 |
| 2004/0239243 | A1 | * | 12/2004 | Roberts | ................ | B60Q 1/2696 |
| | | | | | | 257/E25.02 |

* cited by examiner

*Primary Examiner* — Fernando L Toledo
*Assistant Examiner* — Shawn Shaw Muslim
(74) *Attorney, Agent, or Firm* — Li & Cai Intellectual Property (USA) Office

(57) ABSTRACT

A package structure is provided. The package structure includes at least one optoelectronic device, a lead frame, and an encapsulant. The optoelectronic device is disposed on the lead frame. The lead frame includes at least one lead unit that includes a first lead and a second lead. The first lead has a first bonding part and a first pin. The first bonding part has a first inclined sidewall at an upper end of one side away from the second lead. The second lead has a second pin and a carrying part, of which an upper end has a die-attaching region for carrying the optoelectronic device. The encapsulant covers at least the optoelectronic device, the first bonding part, and the carrying part.

19 Claims, 12 Drawing Sheets

OPTOELECTRONIC PACKAGE STRUCTURE

CROSS-REFERENCE TO RELATED PATENT APPLICATION

This application claims the benefits of priorities to the U.S. Provisional Patent Application Ser. No. 63/212,124 filed on Jun. 18, 2021, Ser. No. 63/284,010 filed on Nov. 30, 2021, and Patent Application No. 202220678650.1, filed on Mar. 25, 2022 in People's Republic of China, which applications are incorporated herein by reference in their entireties.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a package structure applied to an optoelectronic device.

BACKGROUND OF THE DISCLOSURE

In a conventional package structure of optoelectronic components (e.g., light-emitting diodes or laser diodes) adopting a plug-in package, a common state of failure occurs when the optoelectronic devices are soldered to a circuit board, during which wires connected between a chip and a lead frame are easily pulled to cause breakage, resulting in dead lamps. In addition, due to different expansion coefficients of a lead frame and an encapsulant, a joint between the encapsulant and the lead frame may crack, so that the encapsulant cannot seal the optoelectronic devices.

Accordingly, the conventional package structure for the optoelectronic devices may easily have defects due to above-mentioned factors, resulting in lower yields. Therefore, how to overcome the above-mentioned deficiencies by improving a manufacturing process and structural design has become one the important issues to be addressed in the relevant field.

SUMMARY OF THE DISCLOSURE

In response to the above-referenced technical inadequacies, the present disclosure provides a package structure.

In one aspect, the present disclosure provides a package structure, which includes at least one optoelectronic device, a lead frame, and an encapsulant. The at least one optoelectronic device is disposed on the lead frame. The lead frame includes at least one lead unit, and the at least one lead unit includes a first lead and a second lead. The first lead has a first bonding part and a first pin that extends downward from the first bonding part. The second lead has a carrying part and a second pin that extends downward from the carrying part. An upper end of the carrying part has a die-attaching region for carrying the at least one optoelectronic device. The first lead and the second lead are adjacent to each other. The first bonding part has a first inclined sidewall at an upper end of one side away from the second lead. The encapsulant covers at least the at least one optoelectronic device, the first bonding part of the first lead, and the carrying part of the second lead.

Therefore, in the package structure provided by the present disclosure, by virtue of the first bonding part having the first inclined sidewall at the upper end of the one side away from the second lead, a direction of stress released from the first bonding part can be guided, so that a relative displacement between the first bonding part and the carrying part can be decreased, thereby further reducing stress on a wire connected between the first bonding part and the optoelectronic device to lower occurrences of wire breakage.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
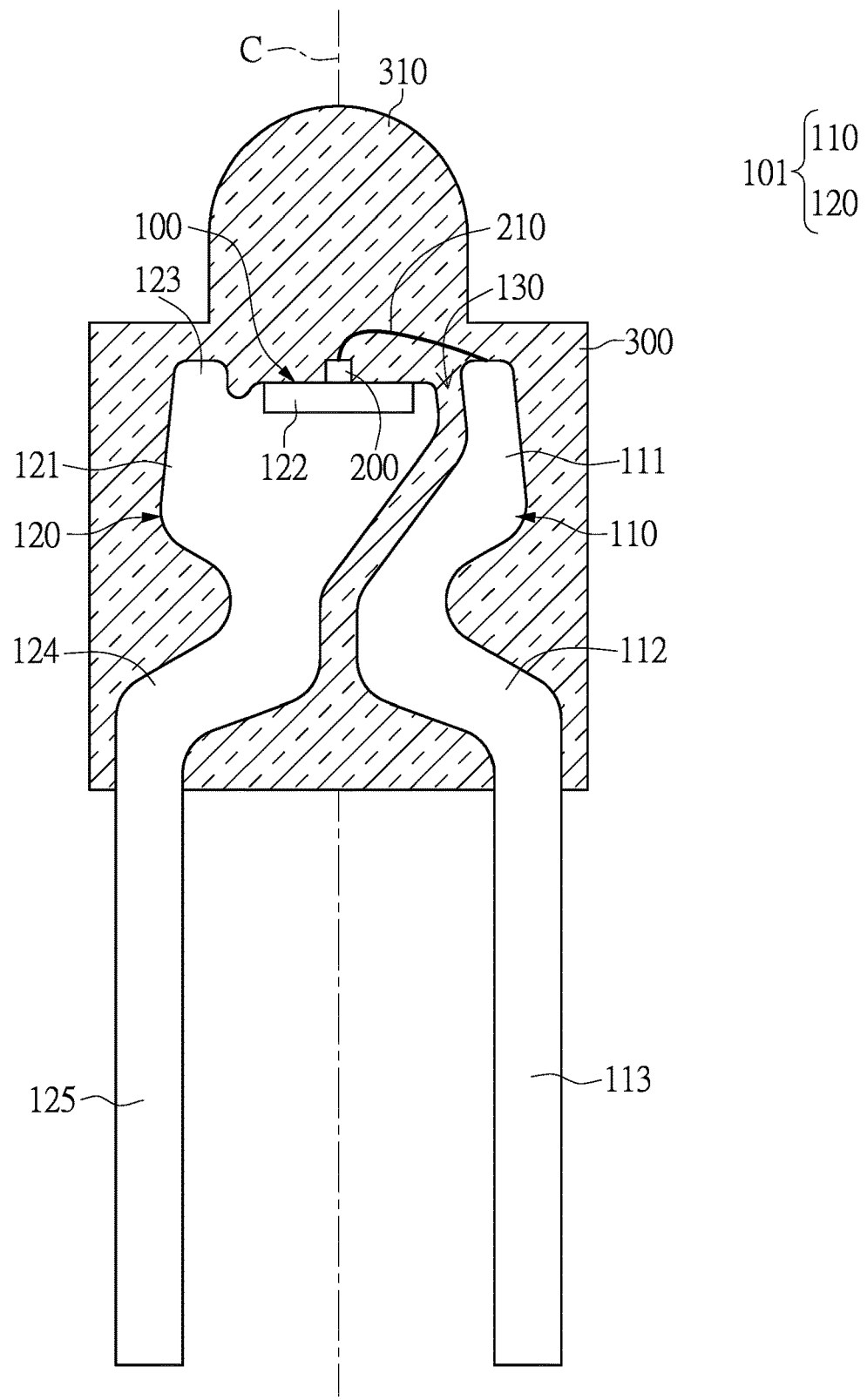
FIG. 1 is schematic cross-sectional view of an integral structure of a package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
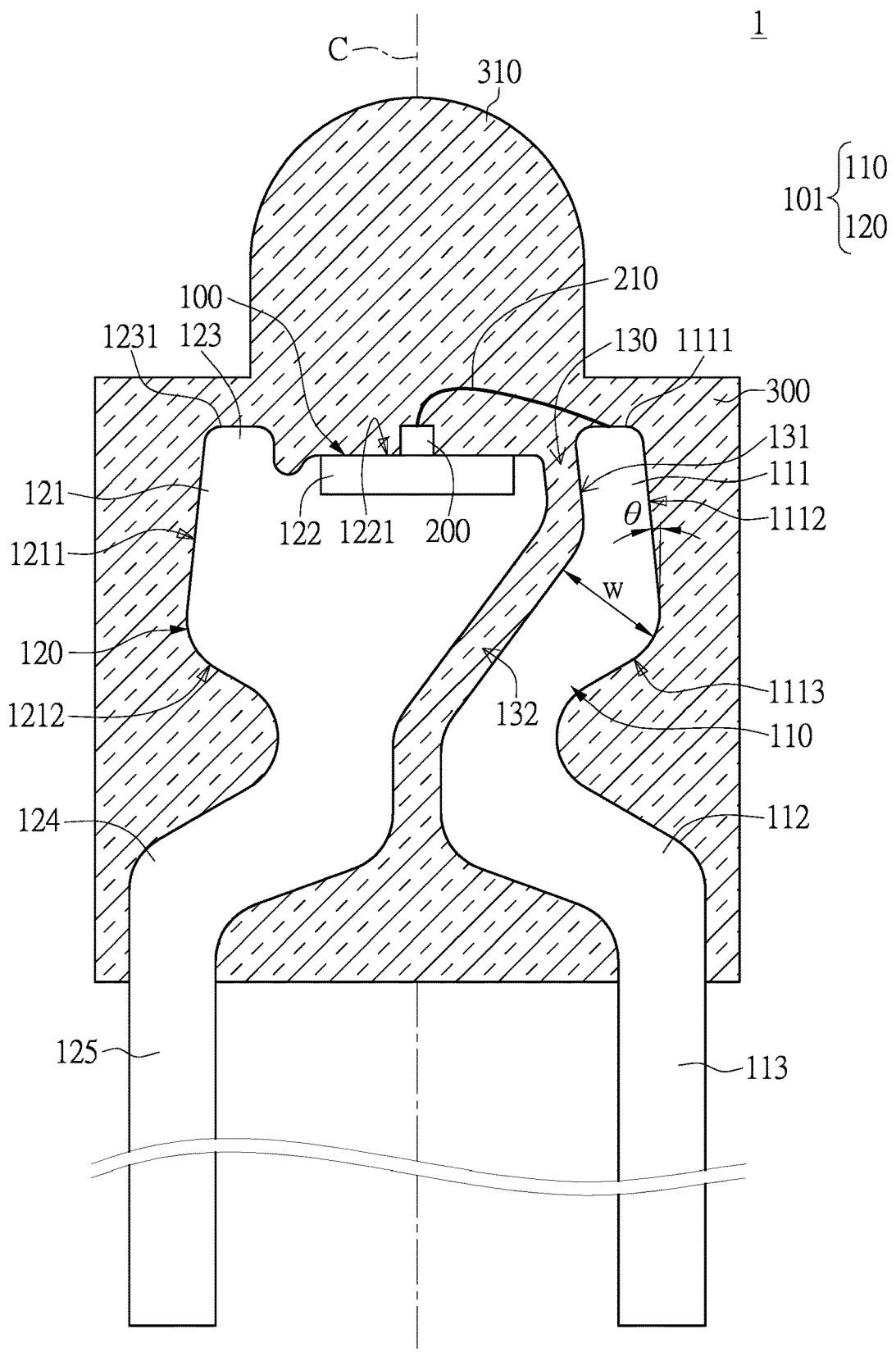
FIG. 2 is an enlarged cross-sectional view of the package structure according to the first embodiment of the present disclosure.
Figure 3:
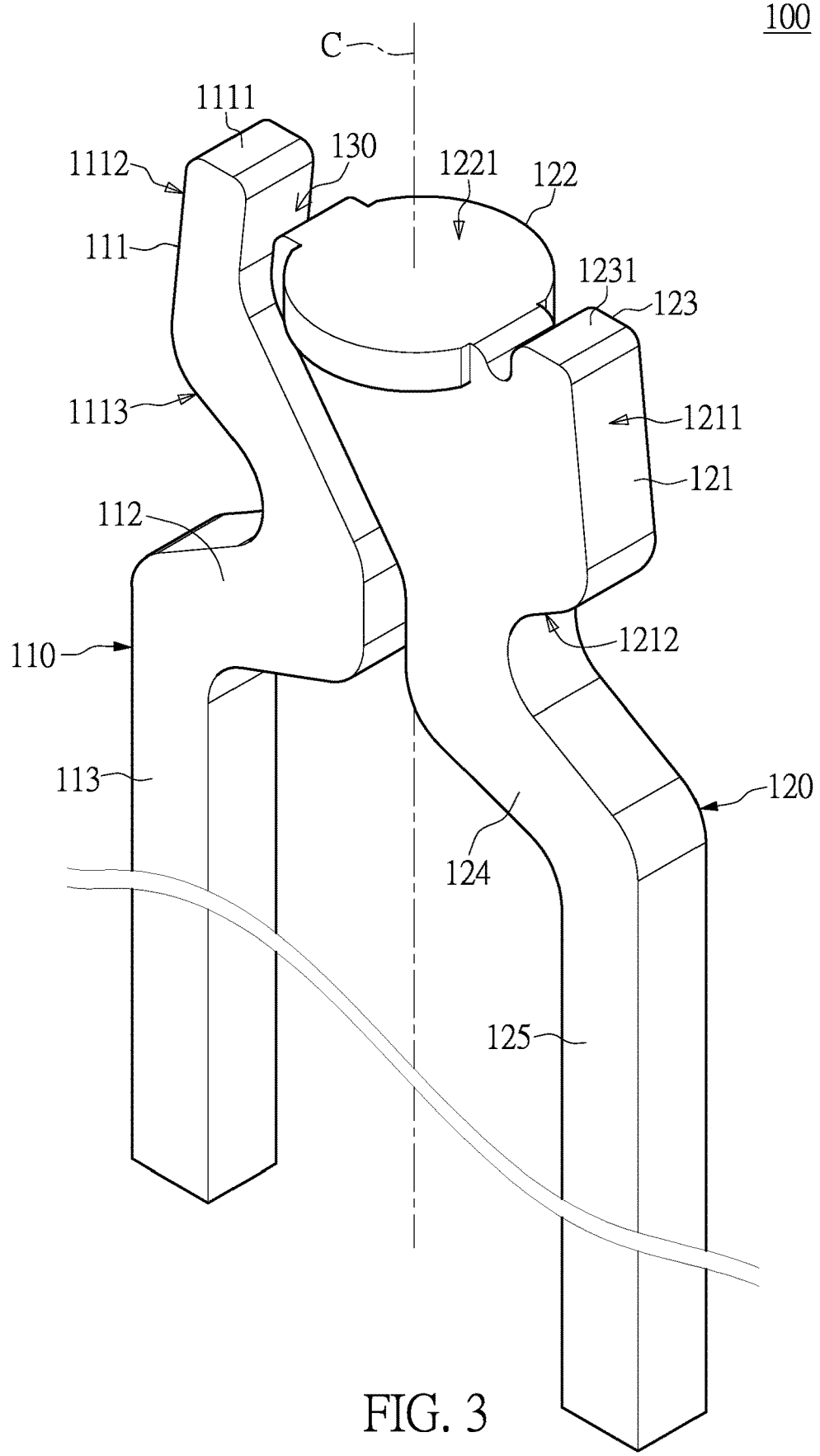
FIG. 3 is a schematic perspective view of a lead frame of the package structure according to the first embodiment of the present disclosure.

Reference is made to FIG. 1 to FIG. 3, in which a first embodiment of the present disclosure is shown. The first embodiment of the present disclosure provides a package structure 1, which includes a lead frame 100, an optoelectronic device 200 disposed on the lead frame 100, and an encapsulant 300 that covers the lead frame 100 and the optoelectronic device 200.

In the present embodiment, the lead frame 100 includes at least one lead unit 101, and the lead unit 101 includes a first lead 110 and a second lead 120 that are arranged adjacent to each other. For ease of illustration, the lead frame 100 can define a vertical axis C, and opposite ends of the lead frame 100 in a direction of the vertical axis C can define an upper end and a lower end that are opposite to each other.

The first lead 110 has a first bonding part 111 and a first pin 113 that extends downward from the first bonding part 111. A first wire contact 1111 is formed at an upper end of the first bonding part 111, and the first bonding part 111 has a first inclined sidewall 1112 at an upper end of one side away from the second lead 120, and a first reverse inclined sidewall 1113 at a lower end of the one side away from the second lead 120.

As shown in FIG. 1 and FIG. 2, when viewed from an orthographic projection of the lead frame 100, the first inclined sidewall 1112 forms a line segment or curve inclined in a direction toward the second lead 120 at the upper end of the first bonding part 111. In the present embodiment, an angle θ between the first inclined sidewall 1112 and the vertical axis C is between 1 degree and 15 degrees. Preferably, the angle θ between the first inclined sidewall 1112 and the vertical axis C is between 3 degrees and 10 degrees.

An upper end of the first reverse inclined sidewall 1113 is connected to a lower end of the first inclined sidewall 1112, and an inclination direction of the first reverse inclined sidewall 1113 is opposite to an inclination direction of the first inclined sidewall 1112. Therefore, when viewed from the orthographic projection of the lead frame 100, the first reverse inclined sidewall 1113 forms a line segment or curve inclined in the direction toward the second lead 120 at the lower end of the first bonding part 111, such that a widest part w is formed at a junction of the first inclined sidewall 1112 and the first reverse inclined sidewall 1113.

In the present embodiment, the first lead 110 also has a first connection part 112 that is connected between the first bonding part 111 and the first pin 113, and an outer side of the first connection part 112 has an inclined line or curve inclined in a direction away from the second lead 120. The first pin 113 is connected to a lower end of the first connection part 112. Further, in the present embodiment, the first pin 113 is substantially parallel to the vertical axis C.

It should be noted that, as shown in FIG. 1, when the package structure 1 is manufactured, at least one wire 210 is connected between the first wire contact 1111 of the first lead 110 and the optoelectronic device 200, and the encapsulant 300 covers the first bonding part 111, the optoelectronic device 200, and the at least one wire 210. In the present disclosure, the first inclined sidewall 1112 and the first reverse inclined sidewall 1113 that each are inclined to the vertical axis C are arranged on the one side of the first bonding part 111 of the first lead 110 of the lead frame 100 that is away from the second lead 120, so that a degree of displacement of the upper end of the first bonding part 111 can be reduced when being subject to a stress from the encapsulant 300, thereby reducing the occurrence of breakage of the wire 210 connected between the optoelectronic device 200 and the first lead 110.

The second lead 120 is adjacent to the first lead 110. The second lead 120 has a carrying part 121 and a second pin 125 that extends downward from the carrying part 121. An upper end of the carrying part 121 has a die-attaching region 122 and a second bonding part 123 arranged on a side of the die-attaching region 122. As shown in FIG. 3, in the present embodiment, a die-bonding plane 1221 that is flat is formed at an upper end of the die-attaching region 122, and a second wire contact 1231 is formed at an upper end of the second bonding part 123.

A second inclined sidewall 1211 is formed at an upper end of one side of the carrying part 121 that is away from the first lead 110, and a second reverse inclined sidewall 1212 is formed at a lower end of the one side of the carrying part 121 that is away from the first lead 110. An angle between the second inclined sidewall 1211 and the vertical axis C is between 1 degree and 15 degrees, and preferably between 3 degrees and 10 degrees. An inclination direction of the second reverse inclined sidewall 1212 is opposite to an inclination direction of the second inclined sidewall 1211. In addition, the second lead 120 of the present embodiment further has a second connection part 124 that is connected between the carrying part 121 and the second pin 125, and an outer side of the second connection part 124 has an inclined line or curve inclined in a direction away from the first lead 110.

Since the second inclined sidewall 1211 and the second reverse inclined sidewall 1212 are arranged on the one side of the carrying part 121 that is away from the first lead 110, the stress of the encapsulant 300 can be dispersed on the second inclined sidewall 1211 and the second reverse inclined sidewall 1212, so that a relative displacement between the carrying part 121 and the first bonding part 111 can be reduced, thereby further reducing the occurrence of breakage of the wire 210 connected between the optoelectronic device 200 and the first bonding part 111.

Another side of the first bonding part 111 of the first lead 110 and another side of the carrying part 121 of the second lead 120 are adjacent to and spaced apart from each other, such that a gap 130 is formed between the first lead 110 and the second lead 120. The gap 130 has an upper opening part 131 that correspondingly extends to the upper end of the carrying part 121 and the upper end of the first bonding part 111, and a turning part 132 that is connected to a lower end of the upper opening part 131. In the present embodiment, the upper opening part 131 is arranged between upper ends respectively of the another side of the first bonding part 111 and of the another side of the carrying part 121 that are adjacent to each other, and an upper end of the upper opening part 131 is inclined in a direction toward the second lead 120. The turning part 132 extends from the lower end of the upper opening part 131 to a position between the first connection part 112 and the second connection part 124, and a lower end of the turning part 132 is inclined in the direction toward the second lead 120.

A width of the gap 130 of the present disclosure is not limited. However, any difference in the width of the gap 130 from the upper opening part 131 all the way to the turning part 132 is less than 0.2 mm, so that the width of the gap 130 is substantially similar all the way from an upper end to a lower end of the gap 130. Therefore, a thickness of the encapsulant 300 in the gap 130 is substantially consistent, so as to avoid an uneven stress being applied to two sidewalls of the gap 130 due to thermal expansion of the encapsulant 300, which results in skewing of the first bonding part 111 and the carrying part 121. Accordingly, the breakage of the wire 210 connected between the optoelectronic device 200 and the first bonding part 111 can be reduced.

In addition, in the present embodiment, in the lead frame 100, a plurality of turning corners are correspondingly formed at corners of the upper end of the first bonding part 111 of the first lead 110, at a junction of the first inclined sidewall 1112 and the first reverse inclined sidewall 1113, at corners of each of the upper ends of the second bonding part 123 and the carrying part 121 of the second lead 120, and at a junction of the second inclined sidewall 1211 and the second reverse inclined sidewall 1212. In addition, each of the turning corners is formed as a rounded corner or a chamfered corner so as to reduce stress concentration of the encapsulant 300 on the first lead 110 and the second lead 120, thereby avoiding cracking of a joint between the encapsulant 300 and each of the first lead 110 and the second lead 120.

The optoelectronic device 200 is disposed on the die-bonding plane 1221 of the carrying part 121, and the optoelectronic device 200 is connected to the first wire contact 1111 and/or the second wire contact 1231 through at least one of the wire 210. In the present embodiment, the optoelectronic device 200 can be a light-emitting chip or a light sensor, and the optoelectronic device 200 can be electrically connected to the first lead 110 and/or the second lead 120 through the wire 210.

It should be noted that, in the present embodiment, although only one of the optoelectronic device 200 is disposed on the die-attaching region 122, the present disclosure is not limited thereto. For example, in one embodiment that is not illustrated in the drawings of the present disclosure, more than one of the optoelectronic devices 200 can be disposed on the die-attaching region 122, and the multiple optoelectronic devices 200 can be light-emitting chips or other types of optoelectronic device. For example, the optoelectronic device of the present disclosure can be the light-emitting chip that emits different colors of light, or other types of optoelectronic device such as a current-limiting chip, a light-sensing chip, and a temperature-sensing chip.

The encapsulant 300 covers at least the optoelectronic device 200, the first bonding part 111 of the first lead 110, and the carrying part 121 of the second lead 120. Preferably, a lower end of the encapsulant 300 correspondingly extends to an upper end of the first pin 113 and an upper end of the second pin 125, so that the first connection part 112 and the second connection part 124 are also covered by the encapsulant 300.

The encapsulant 300 is transparent to light, such that light generated by the optoelectronic device 200 can pass through the encapsulant 300, or external light can pass through the encapsulant 300 to reach the optoelectronic device 200. Further, in the present embodiment, the encapsulant also includes a lens 310 corresponding to and covering the optoelectronic device 200. The lens 310 is used to change a light transmission path of the optoelectronic device 200, and the lens 310 can be configured to be a convex lens or a concave lens according to demands.

It is worth mentioning that, since the encapsulant 300 completely covers the first bonding part 111 and the carrying part 121, the lead frame 100 and the encapsulant 300 can be firmly bonded to each other, thereby reducing instances of defects occurring at a joint between the encapsulant 300 and the lead frame 100.

Second Embodiment

Figure 4:
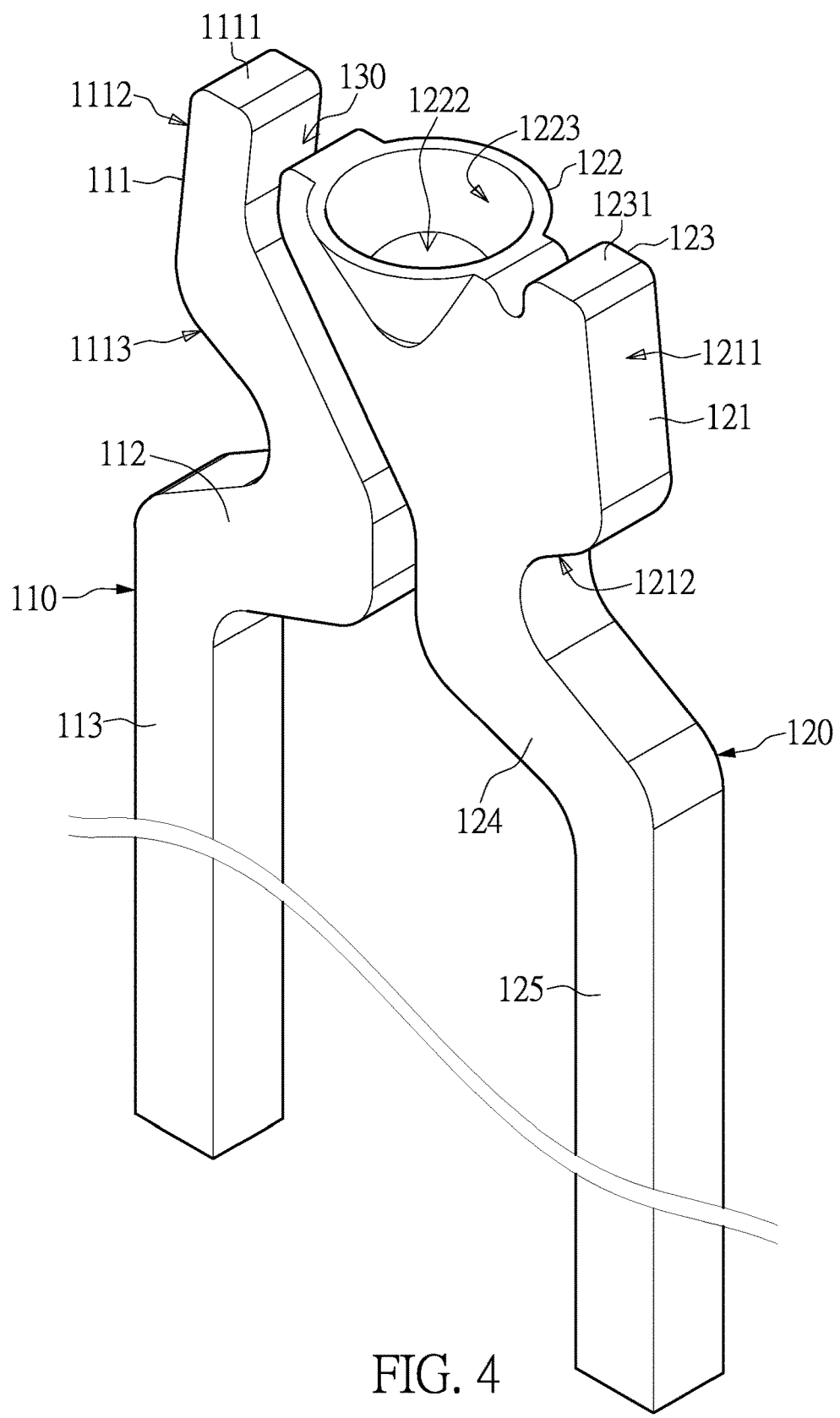
FIG. 4 is a schematic perspective view of a lead frame of a package structure according to a second embodiment of the present disclosure.

Reference is made to FIG. 4, in which a second embodiment of the present disclosure is shown. It should be noted that the present embodiment is similar to the first embodiment mentioned above, and the similarities therebetween will not be reiterated herein.

As shown in FIG. 4, differences between the present embodiment and the first embodiment are that a die cup 1222 is recessed in the die-attaching region 122, and the die cup 1222 has a reflective wall 1223 that is annular. The die cup 1222 is used for disposing the optoelectronic device 200, and light from the optoelectronic device 200 can be reflected by the reflective wall 1223, so as to improve luminous efficiency of the optoelectronic device 200. In addition, a phosphor layer can be filled in the die cup 1222 that is recessed, so that the light from the optoelectronic device 200 can excite the phosphor layer covering the optoelectronic layer 200 to emit light of a predetermined wavelength, such as red light, green light, blue light, yellow light, and white light.

Third Embodiment

Reference is made to FIG. 5 to FIG. 11, in which a third embodiment of the present disclosure is shown. It should be noted that, the present embodiment is similar to the first embodiment and the second embodiment mentioned above, and the similarities therebetween will not be reiterated herein.

In the present embodiment, the package structure 1 includes a lead frame 400, a plurality of optoelectronic devices 500 disposed on the lead frame 400, and an encapsulant 600. The lead frame 400 further includes two lead units 401 and a third lead 430. Each of the two lead units 401 includes a first lead 410 and a second lead 420. Each of the two first leads 410 has a first bonding part 411 and a first pin 413 that extends downward from the first bonding part 411. An upper end of the first bonding part 411 has a first wire contact 4111 arranged thereat. In addition, in the present embodiment, the first bonding part 411 of each of the two first leads 410 has a first inclined sidewall 4112 at an upper end of one side away from the second lead 420, and a first reverse inclined sidewall 4113 at a lower end of the one side away from the second lead 420. Further, each of the two first leads 410 has a first connection part 412 connected between the first bonding part 411 and the first pin 413.

Each of the two second leads 420 has a carrying part 421, a second pin 425 that extends downward from the carrying part 421, and a second connection part 424 that is connected between the carrying part 421 and the second pin 425. An upper end of the carrying part 421 has a die-attaching region 422 and a second bonding part 423 arranged on at least one side of the die-attaching region 422. In addition, the die-attaching region 422 of each of the two lead units 401 can have a die-bonding plane 4221 or a die cup 4222 formed therein. The second bonding part 423 is preferably an upper end of a side of the second leads 420 that is adjacent to the first bonding part 411 of the first lead 410.

The third lead 430 is substantially in a shape of a long rod. A third bonding part 431 is formed at an upper end of the third lead 430, and a third wire contact 4311 is formed at an upper end of the third bonding part 431. The third lead 430 also has a third pin 432 that extends downward from the third bonding part 431. The third lead 430 is arranged between the two lead units 401, and a central axis of the third pin 432 is parallel to a vertical axis C.

In the present embodiment, the two lead units 401 are symmetrically arranged on two sides of the third lead 430. In addition, the second lead 420 of each of the two lead units 401 is arranged on one side of each of the two lead units 401 that is close to the third lead 430, and the first lead 410 is arranged on another side of each of the two lead units 401 that is away from the third lead 430. In other words, the upper end of each of the two first leads 410 is inclined in a direction toward the third lead 430 or the vertical axis C.

The first lead 410 and the second lead 420 of each of the two lead units 401 are adjacent to each other, and a gap 440 is formed between the adjacent first lead 410 and the second lead 420. The gap 440 has an upper opening part 441 that correspondingly extends to the upper end of the carrying part 421 and the upper end of the first bonding part 411, and a turning part 442 that is connected to a lower end of the upper opening part 441. Further, the gap 440 between the upper end of the carrying part 421 and the upper end of the first bonding part 411 is inclined in a direction toward the second lead 420.

The encapsulant 600 covers at least the plurality of optoelectronic devices 500, the first bonding part 411 of each of the two first leads 410, the carrying part 421 of each of the two second leads 420, and the third bonding part 431. Preferably, a lower end of the encapsulant 600 extends to a position correspondingly below lower ends of the two first connection parts 412 and lower ends of the two second connection parts 424, so that the two first connection parts 412 and the two second connection parts 424 are also covered by the encapsulant 600.

Figure 8:
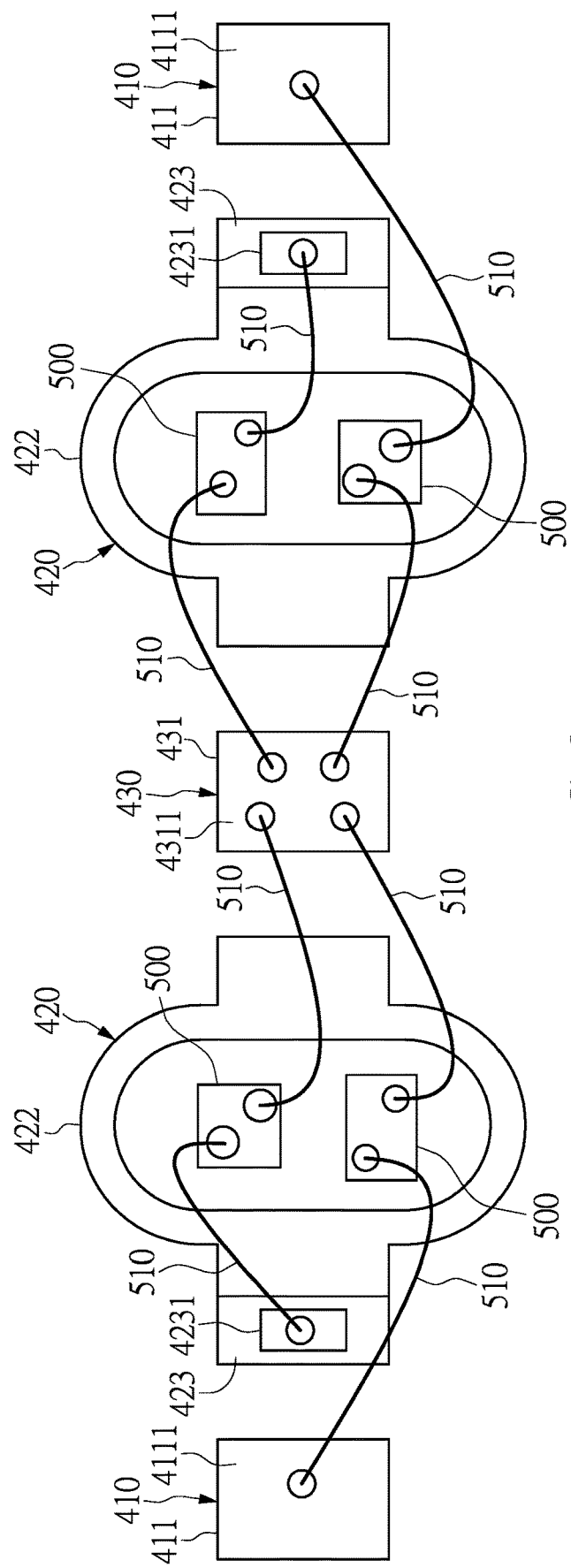
FIGS. 8 to 10 are schematic top views of optoelectronic devices of the package structure respectively arranged in three ways according to the third embodiment of the present disclosure.
Figure 9:
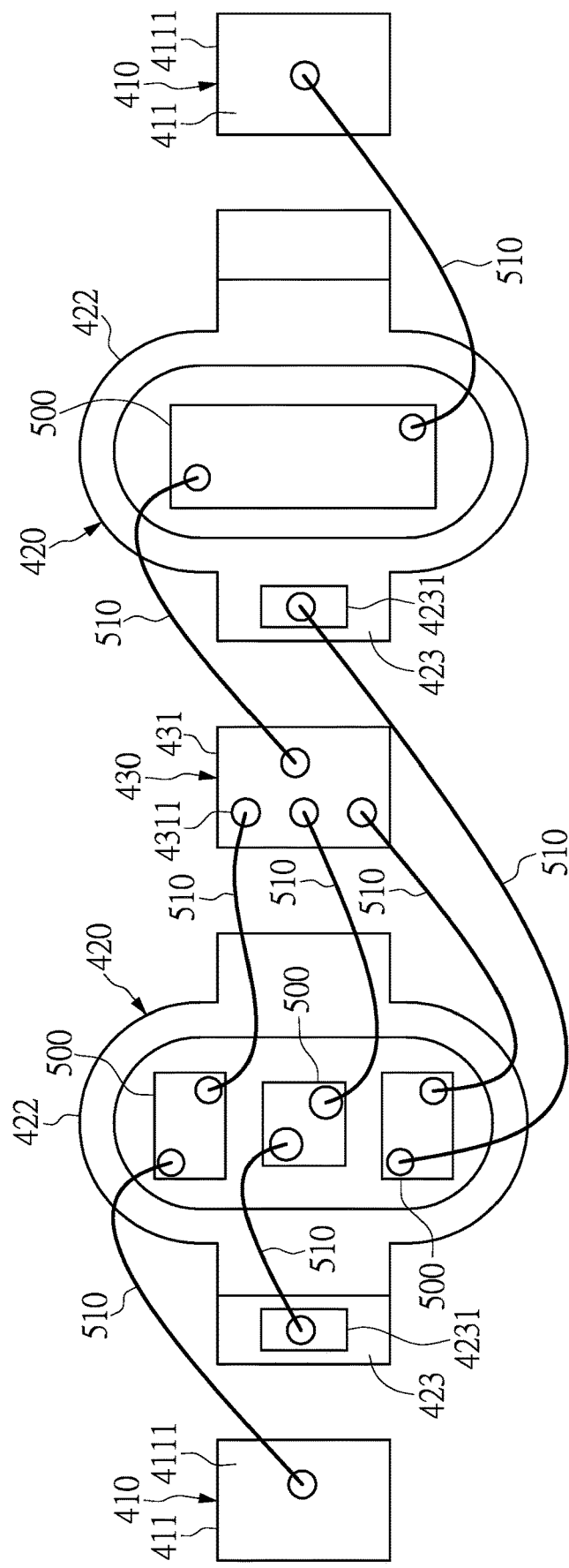

As shown in FIG. 8 and FIG. 9, in the third embodiment of the present disclosure, the plurality of optoelectronic devices 500 can be disposed on the die-attaching region 422 of each of the two lead units 401, and the plurality of optoelectronic devices 500 can be correspondingly connected to one of the two first wire contacts 4111, one of two second wire contacts 4231, or the third wire contact 4311, through at least one of a plurality of wires 510, so that the plurality of optoelectronic devices 500 can be correspondingly and electrically connected to one of the two first leads 410, one of the two second leads 420, or the third lead 430.

In the present embodiment, the plurality of optoelectronic devices 500 can be arranged in various configurations on the two die-attaching regions 422. For example, in one particular embodiment as shown in FIG. 8, two optoelectronic devices 500 are disposed in each of the two die-attaching regions 422, and the plurality of optoelectronic devices 500 can be light-emitting chips that emit predetermined same or different colors of light or other types of optoelectronic devices. Each of the plurality of optoelectronic devices 500 includes two electrodes. In addition, one of the two electrodes of each of the plurality of optoelectronic devices 500 is electrically connected to the third lead 430, and another one of the two electrodes of each of the plurality of optoelectronic devices 500 is electrically connected to one of the two first leads 410 or one of the two second leads 420.

In one particular embodiment as shown in FIG. 9, one optoelectronic device 500 is disposed on one of the two die-attaching regions 422, and three optoelectronic devices 500 are disposed on another one of the two die-attaching regions 422. Each of the plurality of optoelectronic devices 500 includes two electrodes. In addition, one of the two electrodes of each of the plurality of optoelectronic devices 500 is electrically connected to the third wire contact 4311 through one of the plurality of wires 510, and another one of the two electrodes of each of the plurality of optoelectronic devices 500 is electrically connected to one of the two first wire contacts 4111, one of the two second wire contacts 4231 or the third wire contact 4311 through another one of the plurality of wires 510.

It is worth mentioning that, in the third embodiment of the present disclosure, the plurality of optoelectronic devices 500 can be disposed on each of the two die-attaching regions 422, and each of the plurality of optoelectronic devices 500 can be correspondingly and electrically connected to one of the two first leads 410, one of the two second leads 420 or the third lead 430. Therefore, a current value and a voltage input to each of the plurality of optoelectronic devices 500 can be controlled, so that a switch of each of the plurality of optoelectronic devices 500 can be individually controlled, or an intensity of the light emitted from each of the optoelectronic devices 500 can be adjusted, so as to achieve the purpose of mixing or dimming light.

More specifically, in the present embodiment, the plurality of optoelectronic devices 500 emitting different colors of light can be correspondingly disposed on the two die-attaching regions 422 according to practical requirements, and each of the plurality of optoelectronic devices 500 emitting different colors of light is connected to one of the two first leads 410, one of the two second leads 420, or the third lead 430. For example, in the embodiment as shown in FIG. 8, a total of four optoelectronic devices 500 are disposed on the two die-attaching regions 422, and the four optoelectronic devices 500 can be light-emitting chips emitting red light, green light, blue light, yellow light, or white light. In the embodiment as shown in FIG. 9, the one optoelectronic device 500 disposed on the one of the two die-attaching regions 422 is a light-emitting chip for emitting white light, and the three optoelectronic devices 500 disposed on the another one of the two die-attaching regions 422 are light-emitting chips respectively for emitting red light, green light, and blue light.

Through the above configuration, the package structure 1 can have the plurality of optoelectronic devices 500 emitting different colors of light correspondingly disposed on the two die-attaching regions 422. In addition, each of the plurality of optoelectronic devices 500 emitting different colors of light is connected to one of the two first leads 410 or one of the two second leads 420, so that individually controlling a ratio of red light, green light, blue light, yellow light, or white light emitted by each of the plurality of optoelectronic devices 500 is enabled for a purpose of mixing or dimming light.

Further, in the present embodiment, the package structure 1 can also have a wavelength conversion material covering the optoelectronic device 500 disposed on at least one of the two die-attaching regions 422. The optoelectronic device 500 as a light-emitting chip to emit ultraviolet to blue light can excite the covering wavelength conversion material, so that a wavelength of the light emitted from the optoelectronic device 500 can be converted to green light, red light, white light, or the intensity of the light emitted from the optoelectronic device 500 can be enhanced.

Figure 10:
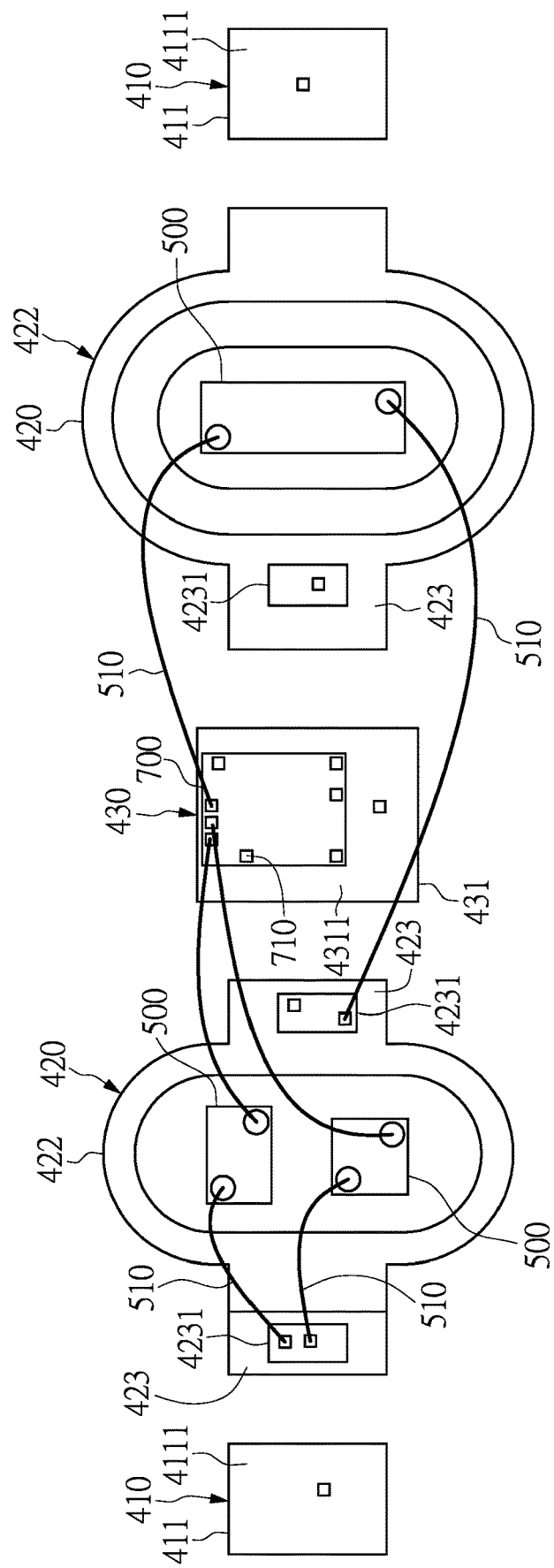

As shown in FIG. 10, in another embodiment, an integrated circuit chip 700 is included. In the present embodiment, at least one optoelectronic device 500 is disposed on the die-attaching region 422 of each of the two second leads 420, and the integrated circuit chip 700 is disposed at an upper end of the third bonding part 431 of the third lead 430. In the present embodiment, the integrated circuit chip 700 can be correspondingly and electrically connected to each of the plurality of optoelectronic devices 500 and the corresponding first lead 410, the corresponding second lead 420, or the corresponding third lead 430. Further, through the integrated circuit chip 700, the purpose of mixing or dimming light can be achieved in the package structure of the present disclosure through a control function provided by the integrated circuit chip 700, or through an external control system or circuit connected to the integrated circuit chip 700 to individually control a switch of each of the plurality of optoelectronic devices 500, or the intensity of the light emitted from each of the optoelectronic devices 500.

Figure 5:
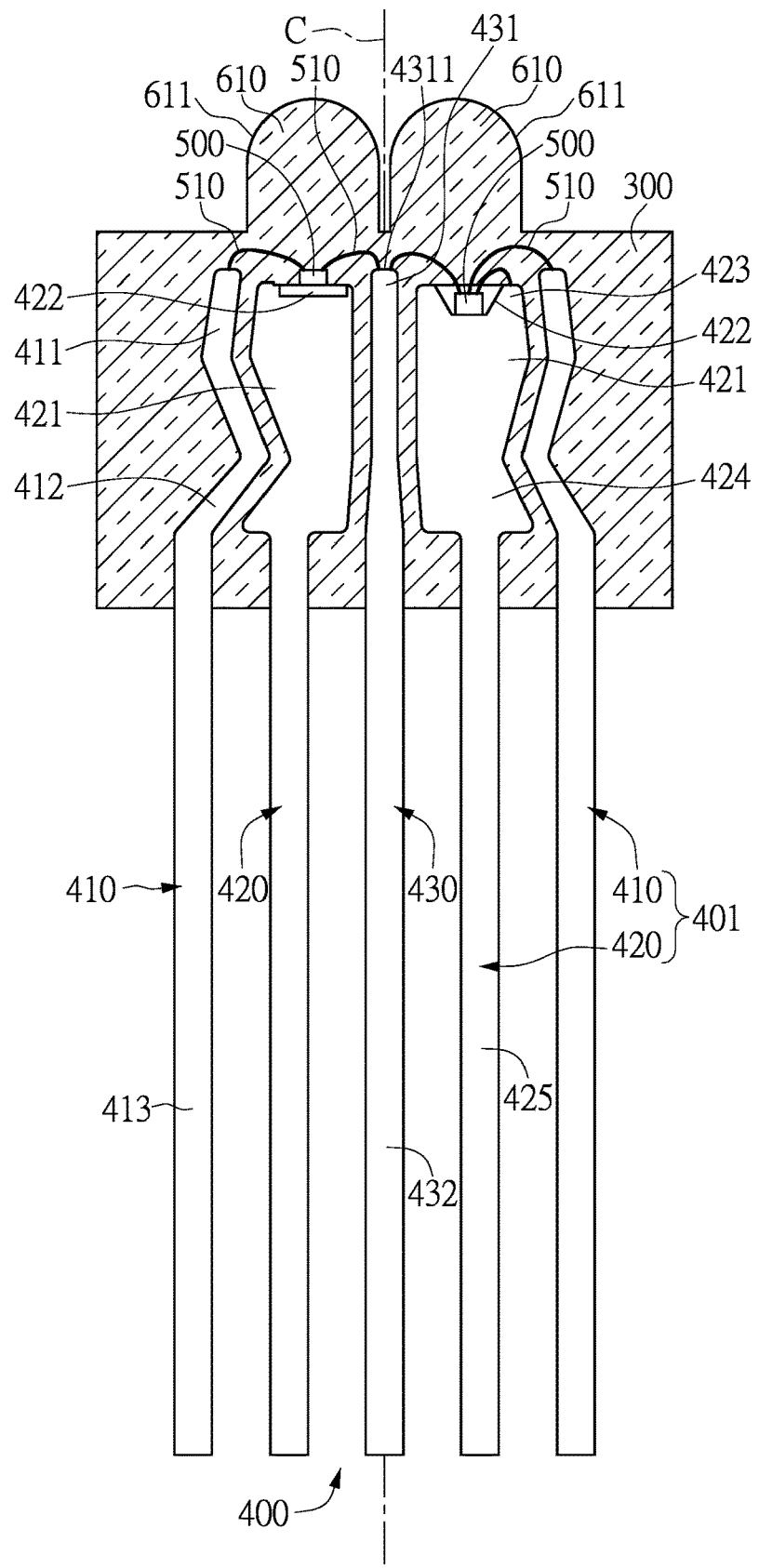
FIG. 5 is schematic cross-sectional view of an integral structure of a package structure according to a third embodiment of the present disclosure.
Figure 6:
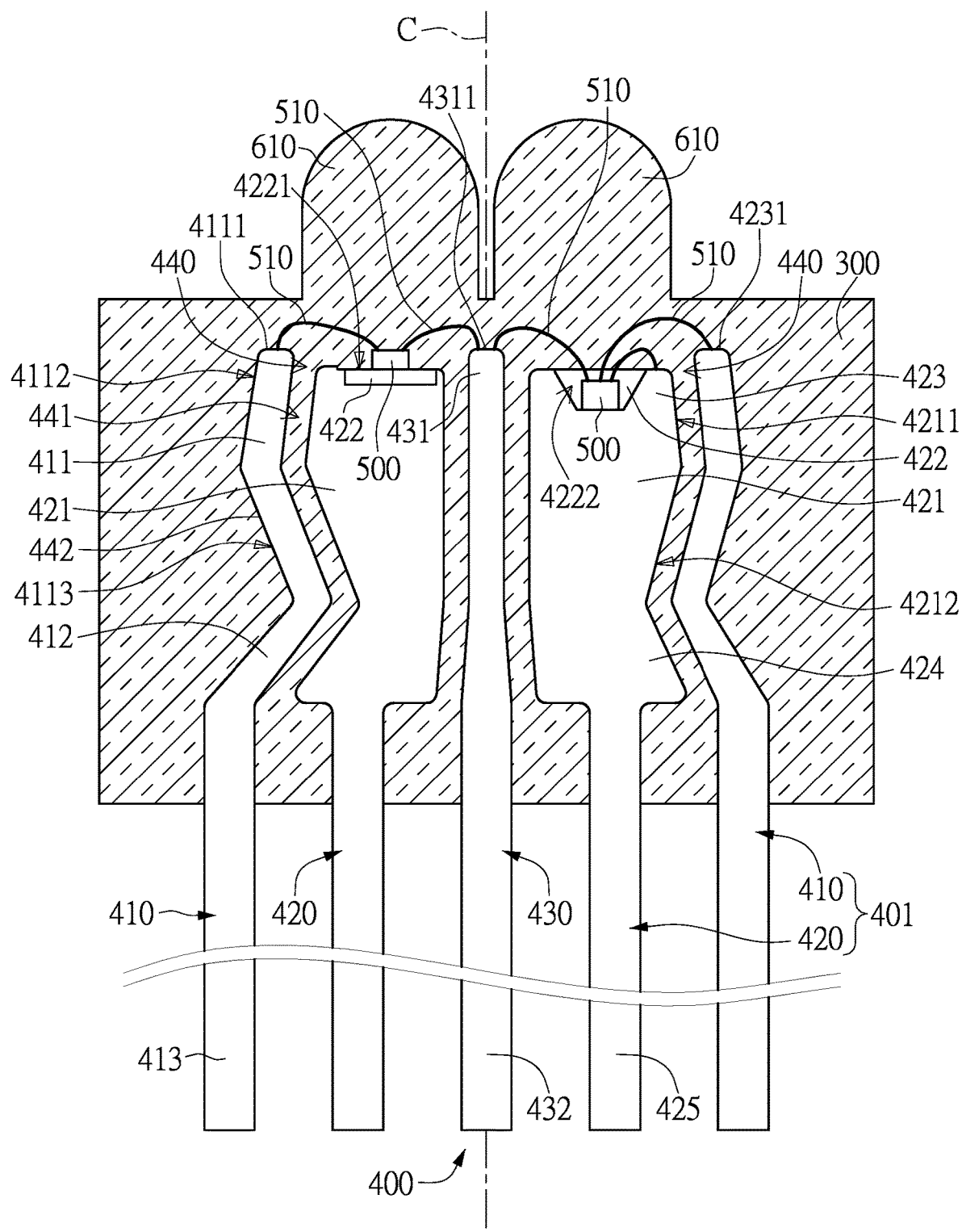
FIG. 6 is an enlarged cross-sectional view of the package structure according to the third embodiment of the present disclosure.
Figure 7:
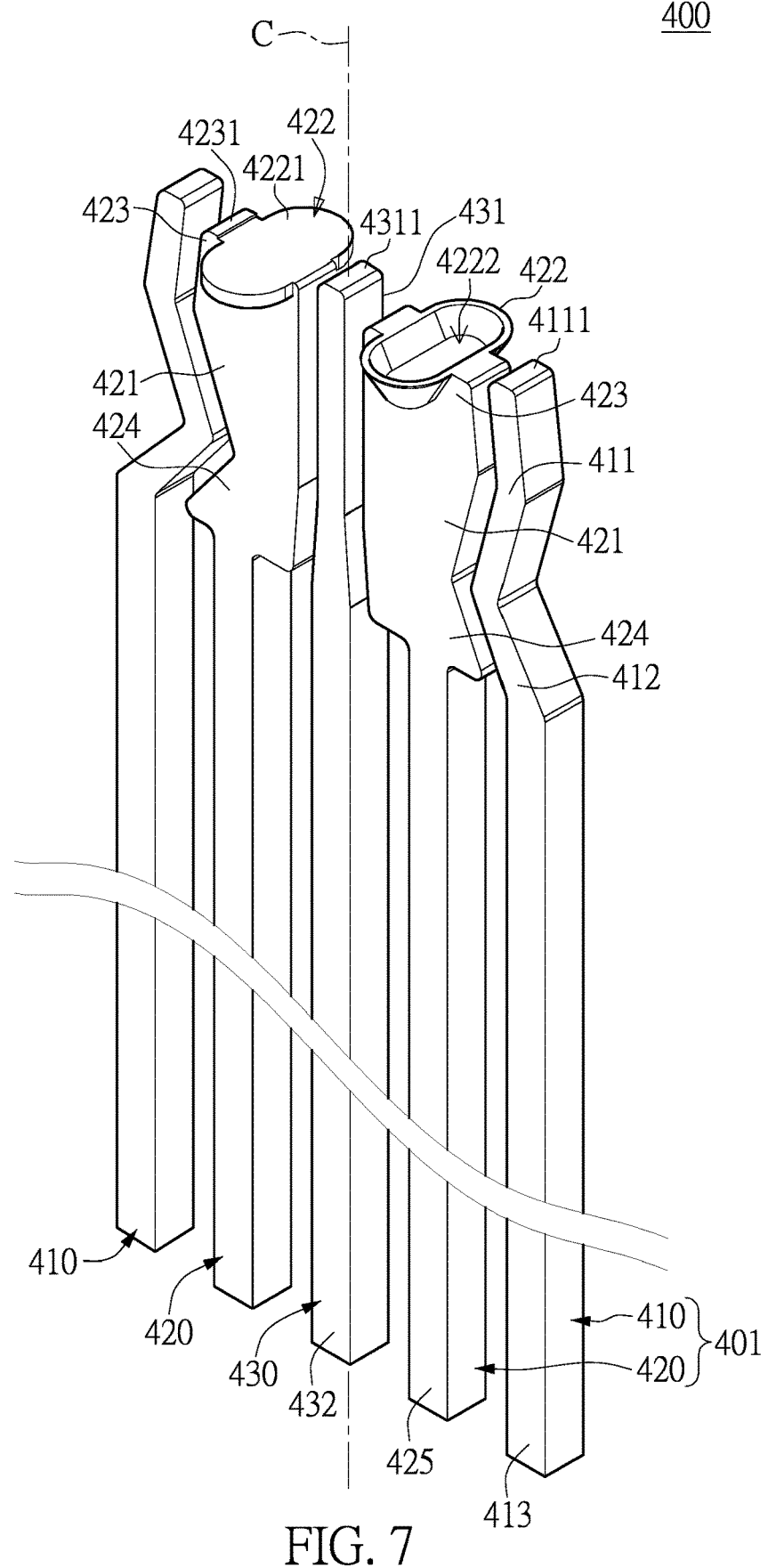
FIG. 7 is a schematic perspective view of a lead frame of the package structure according to the third embodiment of the present disclosure.

It is worth mentioning that, in the present embodiment, a quantity and a position of lens 610 disposed on the encapsulant 600 correspond to the two die-attaching regions 422 of the two lead units 401. In addition, the two lenses 610 can be configured as convex lenses or concave lenses according to practical requirements. For example, as shown in FIG. 5, in the present embodiment, the positions of the two lenses 610 correspond to the two die-attaching regions 422, so that the two lenses 610 correspondingly cover the plurality of optoelectronic devices 500 disposed on the two die-attaching regions 422. In addition, each of the two lenses 610 has a surface protruding toward a light-emitting direction of the optoelectronic device 500, so as to form two convex lenses 611.

Figure 11:
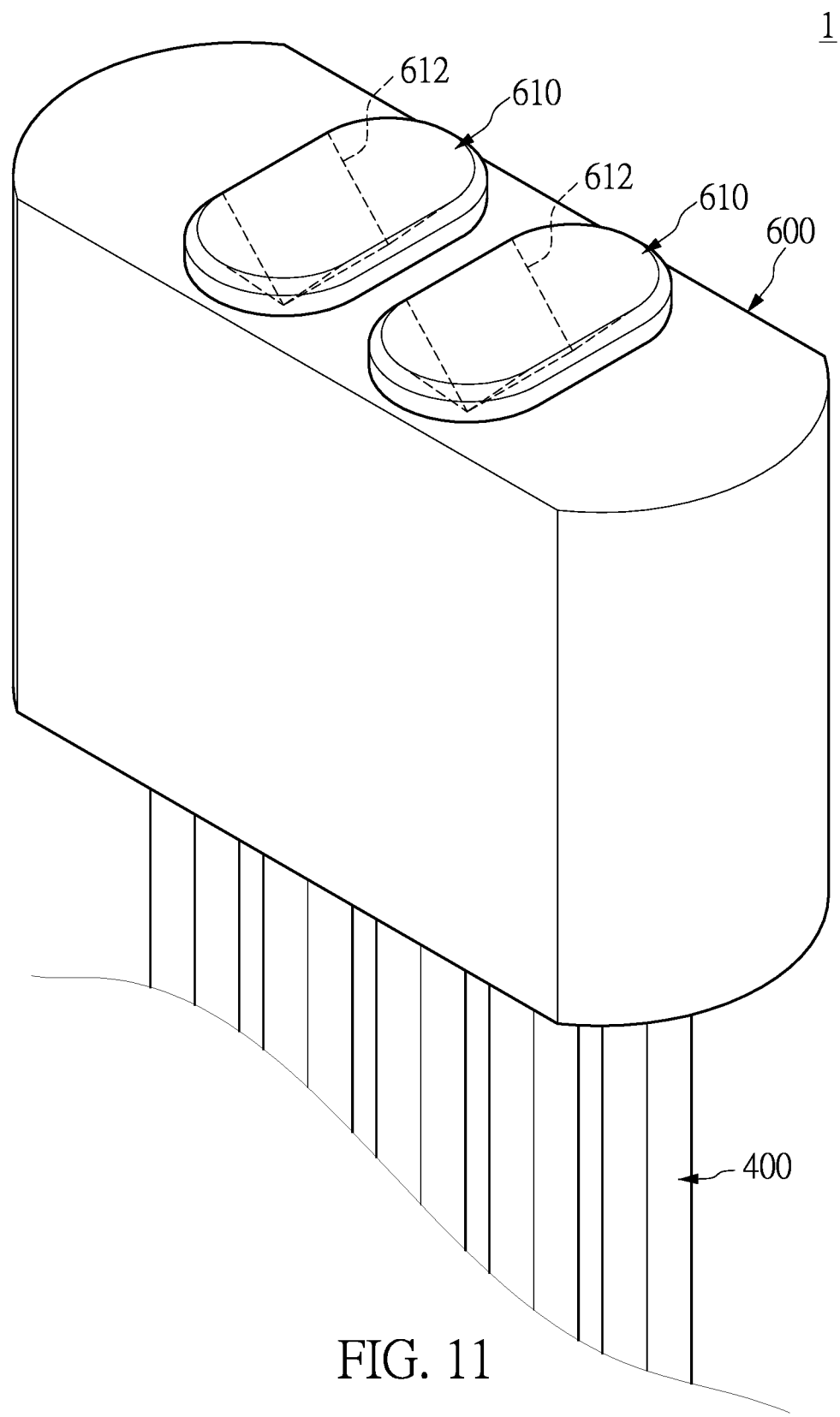
FIGS. 11 and 12 are schematic perspective views of an encapsulant of the package structure having two concave lenses, and one concave lens and one convex lens, respectively, according to the third embodiment of the present disclosure.
Figure 12:
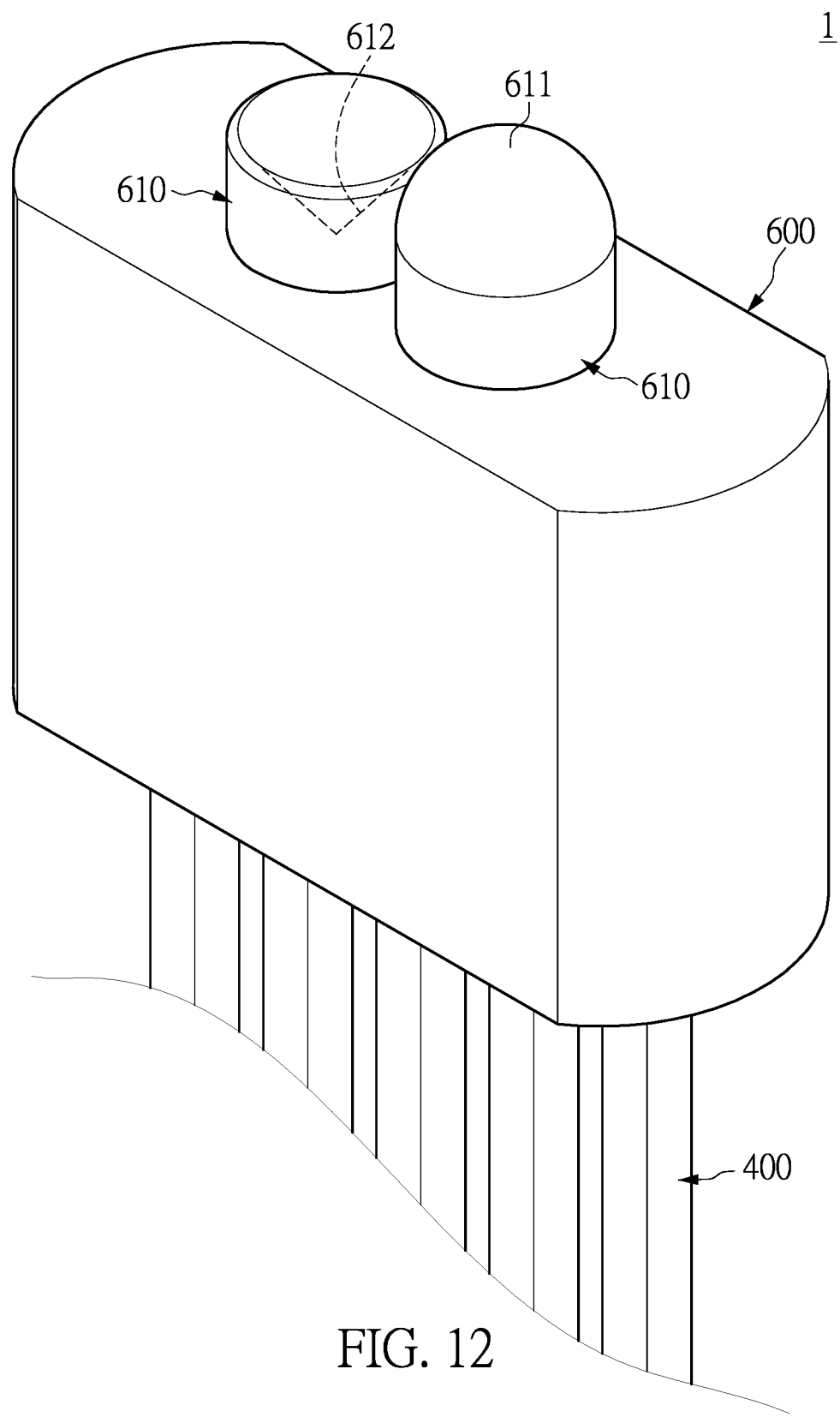

However, the present disclosure is not limited thereto. In one particular embodiment as shown in FIG. 11, each of the two lenses 610 has a concave lens 612 recessed in a direction toward the optoelectronic device 500. In one particular embodiment as shown in FIG. 12, the two lenses 610 respectively has one convex lens 611 and one concave lens 612.

Beneficial Effects of the Embodiments

In conclusion, in the package structure provided by the present disclosure, by virtue of the first bonding part having the first inclined sidewall at the upper end of the one side away from the second lead, a direction of stress released from the first bonding part can be guided, so that the relative displacement between the first bonding part and the carrying part can be decreased, thereby further reducing stress on the wire connected between the first bonding part and the optoelectronic device to lower occurrences of wire breakage.

Further, in the package structure provided by the present disclosure, by virtue of effectively controlling the consistency of a top-to-bottom width of the gap between the first lead and the second lead in the encapsulant, in a subsequent reflow soldering process at a high temperature, the stress on the lead frame after the thermal expansion of the encapsulant in the gap can be more evenly distributed, so that the occurrence of breakage of the wire connected between the first bonding part and the optoelectronic device can be reduced, or peeling of the optoelectronic devices can be less likely to occur. Moreover, by virtue of rounding the corners of the brackets, the stress concentration can be reduced, thereby avoiding cracking of the encapsulant.

Further, in the package structure provided by the present disclosure, by virtue of the plurality of optoelectronic devices being correspondingly disposed on the die-attaching region of each of the two second leads, the plurality of optoelectronic devices being correspondingly and electrically connected to the third lead, one of the two leads, and one of the two leads, and the integrated circuit chip being disposed on the third lead, and being correspondingly and electrically connected to each of the plurality of optoelectronic devices, a multi-chip package or system in package can be easily achieved in the package structure of the present disclosure. Moreover, it is possible to individually control the switch of each of the plurality of optoelectronic devices externally or internally, or to individually control the intensity of the light emitted from each of the optoelectronic devices, so as to achieve the purpose of mixing or dimming light.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optoelectronic package structure, comprising:
    at least one optoelectronic device;
    a lead frame including at least one lead unit, wherein the at least one lead unit includes:
        a first lead having a first bonding part and a first pin that extends downward from the first bonding part;
        a second lead having a carrying part and a second pin that extends downward from the carrying part; wherein an upper end of the carrying part has a die-attaching region for carrying the at least one optoelectronic device, and the at least one optoelectronic device is disposed on the die-attaching region and connected to the first bonding part by at least one wire; and
    a gap formed between the first lead and the second lead, wherein the gap includes:
        an upper opening part extending between the upper end of the carrying part and an upper end of the first bonding part; and
        a turning part connected to a lower end of the upper opening part, and having a bottom extending downward;

wherein the first lead and the second lead are adjacent to each other, the first bonding part has a first inclined sidewall inclinedly extended downward from an upper end of one side of the first bonding part away from the second lead; and an encapsulant covering the at least one optoelectronic device, the first bonding part of the first lead, and the carrying part of the second lead.

2. The optoelectronic package structure according to claim 1, wherein an angle between the first inclined sidewall and a vertical axis is between 1 degree and 15 degrees, preferably between 3 degrees and 10 degrees.

3. The optoelectronic package structure according to claim 1, wherein the first bonding part has a first reverse inclined sidewall inclinedly extended downward from a lower end of the first inclined sidewall, and an inclination direction of the first reverse inclined sidewall is opposite to an inclination direction of the first inclined sidewall; wherein a widest part of the first bonding part is at a junction between the first inclined sidewall and the first reverse inclined sidewall, and the first inclined sidewall extends to the widest part.

4. The optoelectronic package structure according to claim 1, wherein the first lead further has a first connection part connected between the first bonding part and the first pin, and an outer side of the first connection part is inclined in a direction away from the second lead from the bottom of the turning part, wherein the second lead further has a second connection part connected between the carrying part and the second pin, an outer side of the second connection part is inclined in a direction away from the first lead from the bottom of the turning part, so that the first connection part and the second connection part are respectively extend in directions away from each other.

5. The optoelectronic package structure according to claim 1, wherein a difference between a width of the upper opening part and a width of the turning part is less than 0.2 mm.

6. The optoelectronic package structure according to claim 1, wherein a lower end of the encapsulant correspondingly extends to an upper end of the first pin and an upper end of the second pin.

7. The optoelectronic package structure according to claim 1, wherein a die-bonding plane or a die cup is formed at an upper end of the die-attaching region.

8. The optoelectronic package structure according to claim 1, wherein the carrying part has a second inclined sidewall inclinedly extended downward from an upper end of one side of the carrying part away from the first lead.

9. The optoelectronic package structure according to claim 8, wherein an angle between the second inclined sidewall and a vertical axis is between 1 degree and 15 degrees, preferably between 3 degrees and 10 degrees.

10. The optoelectronic package structure according to claim 8, wherein an upper end of the second lead has a second bonding part, the second bonding part has a second reverse inclined sidewall extended from a lower end of the second inclined sidewall away from the first lead, and an inclination direction of the second reverse inclined sidewall is opposite to an inclination direction of the second inclined sidewall.

11. The optoelectronic package structure according to claim 8, wherein a plurality of turning corners are correspondingly formed at corners of the upper end of the first bonding part of the first lead, and at corners of each of the upper ends of the carrying part and the second bonding part of the second lead; wherein each of the plurality of turning corners is formed as a rounded corner or a chamfered corner.

12. The optoelectronic package structure according to claim 8, wherein the lead frame includes two or more lead units, and the lead frame further includes a third lead disposed between any two lead units; wherein the third lead has a third bonding part and a third pin that extends downward from the third bonding part.

13. The optoelectronic package structure according to claim 12, wherein an integrated circuit chip is disposed at an upper end of the third bonding part of the third lead.

14. An optoelectronic package structure, comprising: a lead frame including: two lead units each including: a first lead having a first bonding part and a first pin that extends downward from the first bonding part; and a second lead having a carrying part, a second bonding part, and a second pin that extends downward from the carrying part; wherein an upper end of the carrying part has a die-attaching region, and the second bonding part is an upper end of a side of the second lead that is adjacent to the first lead; wherein the carrying part and an upper end of the first bonding part have a gap therebetween, and the gap is inclined in a direction toward the second lead; and a third lead disposed between the two lead units, and the third lead having a third bonding part and a third pin extending downward from the third bonding part; wherein each of the first leads has a first inclined sidewall extended downward from an upper end of the first bonding part on a side that is away from the second lead, a plurality of optoelectronic devices correspondingly disposed on the die-attaching region of each of the two second leads; and an encapsulant covering the plurality of optoelectronic devices, the two first bonding parts, the two carrying parts, the two second bonding parts, and the third bonding part of the lead frame.

15. The optoelectronic package structure according to claim 14, wherein each of the two first leads further has a first reverse inclined sidewall inclinedly extended downward from a lower end of the first inclined sidewall; wherein an inclination direction of the first reverse inclined sidewall of one of the two first leads is opposite to an inclination direction of the first inclined sidewall of the one of the two first leads; wherein a widest part of each of the two first bonding parts is at a junction between the first inclined sidewall and the first reverse inclined sidewall, and the first inclined sidewall extends to the widest part.

16. The optoelectronic package structure according to claim 14, wherein an upper end of the encapsulant has two lenses respectively covering tops of the two die-attaching regions of the two second leads, and the two lenses are convex lenses, concave lenses, or a combination of the convex lens and the concave lens.

17. The optoelectronic package structure according to claim 14, wherein a die-bonding plane or a die cup is formed at an upper end of each of the two die-attaching regions.

18. The optoelectronic package structure according to claim 14, wherein a wavelength conversion material covering the optoelectronic devices is disposed above at least one of the two die-attaching regions.

19. An optoelectronic package structure, comprising:
a lead frame including:
two lead units each including:
a first lead having a first bonding part and a first pin that extends downward from the first bonding part; and
a second lead having a carrying part, a second bonding part, and a second pin that extends downward from the carrying part; wherein an upper end of the carrying part has a die-attaching region, and the second bonding part is an upper end of a side of the second lead that is adjacent to the first lead;

wherein the carrying part and an upper end of the first bonding part have a gap therebetween, and the gap is inclined in a direction toward the second lead; and a third lead disposed between the two lead units, and the third lead having a third bonding part and a third pin extending downward from the third bonding part;

a plurality of optoelectronic devices correspondingly disposed on the die-attaching region of each of the two second leads; and an encapsulant covering the plurality of optoelectronic devices, the two first bonding parts, the two carrying parts, the two second bonding parts, and the third bonding part of the lead frame;

wherein one electrode of each of the plurality of optoelectronic devices is electrically connected to the third lead and another electrode of each of the plurality of optoelectronic devices is correspondingly and electrically connected to the first lead or the second lead, or wherein, when an integrated circuit chip is disposed at an upper end of the third bonding part of the third lead, the one electrode of each of the plurality of optoelectronic devices is electrically connected to the integrated circuit chip and the another electrode of each of the plurality of optoelectronic devices is correspondingly and electrically connected to the first lead or the second lead.

* * * * *